United States Patent
D'Evelyn et al.

(10) Patent No.: US 7,063,741 B2
(45) Date of Patent: Jun. 20, 2006

(54) HIGH PRESSURE HIGH TEMPERATURE GROWTH OF CRYSTALLINE GROUP III METAL NITRIDES

(75) Inventors: Mark Philip D'Evelyn, Niskayuna, NY (US); Steven William Webb, Worthington, OH (US); Suresh Shankarappa Vagarali, Columbus, OH (US); Yavuz Kadioglu, Clifton Park, NY (US); Dong-Sil Park, Niskayuna, NY (US); Zheng Chen, Dublin, OH (US)

(73) Assignee: General Electric Company, Niskayuna, NY (US)

( * ) Notice: Subject to any disclaimer, the term of this patent is extended or adjusted under 35 U.S.C. 154(b) by 98 days.

(21) Appl. No.: 10/063,164

(22) Filed: Mar. 27, 2002

(65) Prior Publication Data

US 2003/0183155 A1 Oct. 2, 2003

(51) Int. Cl.
*C30B 9/12* (2006.01)

(52) U.S. Cl. .............. 117/73; 117/74; 117/76; 117/78; 117/81; 117/213; 117/11; 117/952

(58) Field of Classification Search .......... 117/11, 117/73, 74, 76, 78, 81, 213, 952
See application file for complete search history.

(56) References Cited

U.S. PATENT DOCUMENTS

| | | | |
|---|---|---|---|
| 3,933,573 A | | 1/1976 | Dugger |
| 4,202,930 A * | | 5/1980 | Kokta et al. ............. 428/697 |
| 5,868,837 A * | | 2/1999 | DiSalvo et al. ............... 1/1 |
| 5,911,824 A * | | 6/1999 | Hammond et al. ........ 117/81 |
| 5,942,148 A * | | 8/1999 | Preston ............... 252/62.3 GA |
| 5,993,545 A * | | 11/1999 | Lupton et al. ............ 117/208 |
| 6,177,057 B1 * | | 1/2001 | Purdy ..................... 423/409 |
| 6,270,569 B1 * | | 8/2001 | Shibata et al. ............. 117/68 |
| 6,398,867 B1 * | | 6/2002 | D'Evelyn et al. .......... 117/11 |
| 6,592,663 B1 * | | 7/2003 | Sarayama et al. ......... 117/68 |
| 2003/0164138 A1 * | | 9/2003 | Sarayama et al. ......... 117/84 |
| 2003/0209191 A1 * | | 11/2003 | Purdy ....................... 117/84 |
| 2004/0003495 A1 * | | 1/2004 | Xu ............................ 29/832 |

FOREIGN PATENT DOCUMENTS

| | | |
|---|---|---|
| FR | 2 796 657 | 1/2001 |
| JP | 60122797 | 7/1985 |
| JP | 11060394 A * | 3/1999 |
| JP | 2001058900 | 3/2001 |
| WO | WO 98/55671 | 12/1998 |
| WO | WO 01/24921 | 4/2001 |

OTHER PUBLICATIONS

Patent Abstracts of Japan. English Abstract and English computer translation. (1999).*

(Continued)

*Primary Examiner*—Duane Smith
*Assistant Examiner*—Matthew J. Song
(74) *Attorney, Agent, or Firm*—Shawn A. McClintic; William E. Powell, III (57) ABSTRACT

A method of forming at least one single crystal of a Group III metal nitride. The method includes the steps of: providing a flux material and a source material comprising at least one Group III metal selected from the group consisting of aluminum, indium, and gallium, to a reaction vessel; sealing the reaction vessel; heating the reaction vessel to a predetermined temperature and applying a predetermined pressure to the vessel. The pressure is sufficient to suppress decomposition of the Group III metal nitride at the temperature. Group III metal nitrides, as well as electronic devices having a Group III metal nitride substrate formed by the method are also disclosed.

100 Claims, 3 Drawing Sheets

OTHER PUBLICATIONS

Joseph W. Kolis et al., Materials Research Society, *"Materials Chemistry and Bulk Crystal Growth of Group III Nitrides in Supercritical Ammonia"*, vol. 495, pp. 367-372, 1998.

Masato Aoki et al., American Chemical Society, *"Growth of 5mm GaN Single Crystals at 750° C. from an Na-Ga Melt"*, Crystal Growth & Design, vol. 1, No. 2, pp. 119-122, Feb. 3, 2001.

S. Porowski, High Pressure Research Center, Polish Academy of Sciences, Sokolowska 29/37, 01-142, Warsaw, Poland, sylvek@unipress.waw.pl, *"Near Defect Free GaN Substrates"*, 1999.

S. Porowski and I. Grzegory, High Pressure Research Center, Polish Academy of Sciences, ul. Sokolowska 29/37, 01-142, Warsaw, Poland, *"Growth of GaN Single Crystals Under High Nitrogen Pressure"*, Chapter 9, pp. 295313, 1997.

M. Yano et al., *"Growth of Nitride Crystals, BN, AlN and GaN By Using a Na Flux"*, Diamond and Related Materials, Elsevier Science Publishers, Amsterdam, NL, vol. 9, No. 3-6, pp. 512-515, Apr. 2000.

Masaichi Yano et al., *"Control of Nucleation Site and Growth Orientation of Bulk GaN Crystals"*, Japanese Journal of Applied Physics, Publication Office Japanese Journal of Applied Physics, Tokyo, Japan, vol. 38, No. 10A, Part 2, pp. L1121-L1123, Oct. 1, 1999.

* cited by examiner

HIGH PRESSURE HIGH TEMPERATURE GROWTH OF CRYSTALLINE GROUP III METAL NITRIDES

BACKGROUND OF INVENTION

The invention relates to the growth of crystals of Group III metal nitrides. More particularly, the invention relates to the growth of Group III metal nitride crystals by recrystallization from a flux. Even more particularly, the invention relates to the growth of Group III metal nitride crystals by recrystallization from either a solvent or a melt under high pressure, high temperature conditions.

During the past decade there has been considerable interest in the nitrides of the Group III metals (also referred to hereinafter as "Group III metal nitrides"); namely aluminum nitride (also referred to hereinafter as "AlN"), gallium nitride (also referred to hereinafter as "GaN"), and indium nitride (also referred to hereinafter as "InN") based optoelectronic devices, including, for example, light emitting diodes (LEDs) and laser diodes (LDs). The active layers in such devices typically comprise solid solutions of GaN, AlN, and InN and typically include n-doped layers, p-doped layers, heterostructures, and the like. The performance of these devices, including light emission efficiency, lifetime, and reverse bias current, is often degraded by the presence of threading dislocations, vacancies, and impurities in the active layers and in underlying and overlaying epitaxial layers. Such devices are typically grown on lattice-mismatched substrates such as sapphire or SiC, resulting in a high concentration of threading dislocations that propagate into the active layer. In the case of GaN-based devices, for example, the use of a high quality GaN substrate would greatly reduce the concentration of threading dislocations and other defects in the homoepitaxial active layers and improve device performance.

Gallium nitride single crystals that are of suitable quality for electronic applications have been obtained by reacting nitrogen ($N_2$) gas with gallium metal at pressures and temperatures in the range of 10–20 kilobar and 1200° C. to 1500° C., respectively. Other methods that have been used to grow crystalline GaN include chemical vapor deposition (CVD), hydride vapor phase epitaxy, crystallization in gallium/sodium alloys, and recrystallization from supercritical ammonia. The GaN crystals grown under these conditions exhibit varying degrees of quality and are limited in size. In addition, the growth rate of GaN crystals obtained by these processes is generally low (about 0.1 mm/hr).

The methods that are currently used to grow gallium nitride crystals are unable to produce large crystals of Group III metal nitrides at acceptable growth rates and that are of high quality. Therefore, what is needed is a method of growing Group III metal nitride crystals that are sufficiently large to serve as commercially viable substrates for electronic devices. What is also needed is a method of growing Group III metal nitride crystals that are of high quality and have low concentrations of impurities and dislocations. What is further needed is a method of growing Group III metal nitride crystals at a high growth rate.

SUMMARY OF INVENTION

The present invention meets these and other needs by providing a method of forming at least one single crystal of a Group III metal nitride by mixing poorly crystallized, amorphous, or crystalline Group III metal nitride powder or polycrystalline Group III metal nitride material with a suitable flux material and processing the mixture at high pressures and high temperatures. As described in the present invention, flux is understood to be a molten inorganic salt that is solid at near room temperature (about 30° C.).

Accordingly, one aspect of the invention is to provide a method of forming at least one single crystal of a Group III metal nitride. The method comprises the steps of: providing a source material to a reaction vessel, wherein the source material comprises at least one Group III metal selected from the group consisting of aluminum, indium, and gallium, and wherein the reaction vessel has an inner chamber and is sealable with respect to nitrogen and chemically inert; providing a flux material to the reaction vessel, wherein the flux material is a solid at about 30° C.; sealing the reaction vessel; heating the reaction vessel to a predetermined temperature and applying a predetermined pressure to the vessel, wherein the predetermined pressure is sufficient to suppress decomposition of the Group III metal nitride at the predetermined temperature; and forming at least one single crystal of the Group III metal nitride.

A second aspect of the invention is to provide a method of dissolving a source material for a Group III metal nitride in a flux material. The method comprises the steps of: providing the source material to a reaction vessel, wherein the source material comprises at least one Group III metal selected from the group consisting of aluminum, indium, and gallium, and wherein the reaction vessel has an inner chamber and is sealable with respect to nitrogen and is chemically inert; providing a flux material to the reaction vessel, wherein the flux material is a solid at about 30° C.; sealing the reaction vessel; heating the reaction vessel to a predetermined temperature and applying a predetermined pressure to the vessel, wherein the predetermined pressure is sufficient to suppress decomposition of the Group III metal nitride at the predetermined temperature; melting the flux material; applying a predetermined pressure to the vessel, wherein the predetermined pressure is sufficient to suppress decomposition of the Group III metal nitride at the predetermined temperature; and dissolving the source material in the flux material.

A third aspect of the invention is to provide a method of forming at least one single crystal of a Group III metal nitride. The method comprises the steps of: providing a source material to a reaction vessel, wherein the source material comprises at least one Group III metal selected from the group consisting of aluminum, indium, and gallium, and wherein the reaction vessel has an inner chamber and is sealable with respect to nitrogen and chemically inert; providing a flux material to the reaction vessel, wherein the flux material is a solid at about 30° C.; sealing the reaction vessel; heating a first end of the reaction vessel containing the source material to a first temperature and a second end of the reaction vessel opposite the first end to a second temperature, wherein the first temperature is different from the second temperature; applying a predetermined pressure to the vessel, wherein the predetermined pressure is sufficient to suppress decomposition of the Group III metal nitride at the predetermined temperature; melting the flux material; dissolving the source material in the flux material; and forming at least one single crystal of the Group III metal nitride in the second end of the reaction vessel.

A fourth aspect of the invention is to provide a Group III metal nitride single crystal. The Group III metal nitride single crystal is formed by a process comprising the steps of: providing a source material to a reaction vessel, wherein the source material comprises at least one Group III metal selected from the group consisting of aluminum, indium, and gallium, and wherein the reaction vessel is sealable with respect to nitrogen and chemically inert; providing a flux material to the reaction vessel, wherein the flux material is a solid at about 30° C.; sealing the reaction vessel; heating the reaction vessel to a predetermined temperature and applying a predetermined pressure to the vessel, wherein the predetermined pressure is sufficient to suppress decomposition of the Group III metal nitride at the predetermined temperature; and forming at least one single crystal of the Group III metal.

A fifth aspect of the invention is to provide at least one single crystal of a Group III metal nitride. The Group III metal nitride single crystal is formed by a process comprising the steps of: providing a source material to a reaction vessel, wherein the source material comprises at least one Group III metal selected from the group consisting of aluminum, indium, and gallium, and wherein the reaction vessel is sealable with respect to nitrogen and chemically inert; providing a flux material to the reaction vessel, wherein the flux material is a solid at about 30° C.; sealing the reaction vessel; heating a first end of the reaction vessel containing the source material to a first temperature and a second end of the reaction vessel opposite the first end to a second temperature, wherein the first temperature is different from the second temperature; melting the flux material; dissolving the source material in the flux material; and forming at least one single crystal of the Group III metal nitride in the second end of the reaction vessel.

These and other aspects, advantages, and salient features of the present invention will become apparent from the following detailed description, the accompanying drawings, and the appended claims.

DETAILED DESCRIPTION

In the following description, like reference characters designate like or corresponding parts throughout the several views shown in the figures. It is also understood that terms such as "top," "bottom," "outward," "inward," and the like are words of convenience and are not to be construed as limiting terms.

Figure 1:
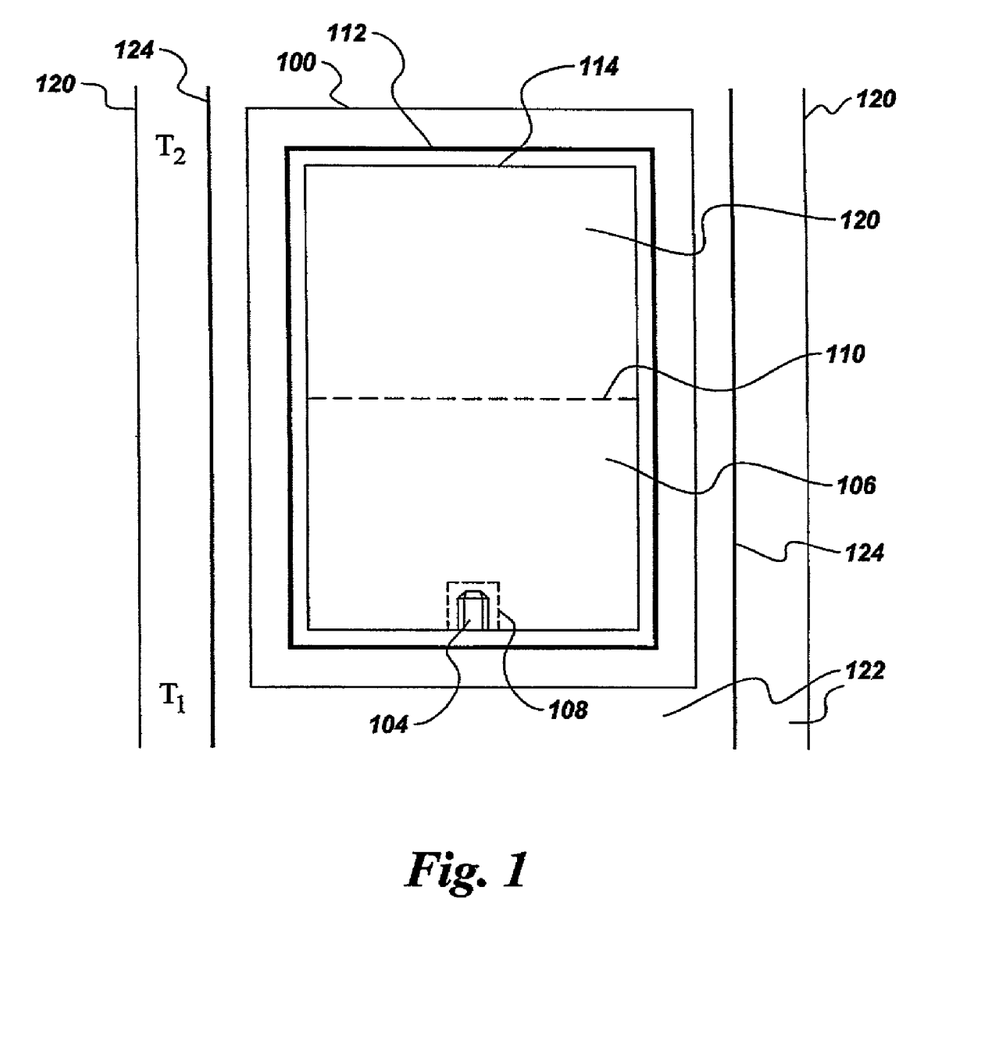
FIG. 1 is a schematic representation of a cross-section of a reaction vessel of the present invention disposed in a pressure cell.

Referring to the drawings in general and to FIG. 1 in particular, it will be understood that the illustrations are for the purpose of describing a preferred embodiment of the invention and are not intended to limit the invention thereto. While the detailed description may at some point describe the growth of gallium nitride (GaN) in particular, it should be understood that the invention also encompasses the growth of nitrides of the other Group III metals, namely, aluminum and indium, as well as mixed nitrides of these Group III metals.

The nitrides of the Group III metals aluminum, gallium, and indium (also referred to hereinafter as "Group III metal nitrides") are generally formed from a source material 102 comprising the particular Group III metal (or metals) in elemental or compound form. Gallium nitride single crystals, for example, are formed from a solid source material comprising gallium. The source material 102 may in the case of GaN comprise GaN powder, polycrystalline GaN, elemental gallium, or a gallium compound other than GaN. The GaN powder may be one of a polycrystalline, monocrystalline, amorphous GaN, or sintered GaN powder. The source material 102 may also comprise compounds containing at least one Group III metal. Such compounds include, but are not limited to Group III metal halides (e.g., gallium halides: i.e., gallium fluorides, chlorides, bromides and iodides). The source material may be provided in densified form. Densification may be achieved by cold-pressing the source material 102 into a pill or by sintering, as described by D'Evelyn et al. in U.S. patent application Ser. No. 10/001,575, filed on Nov. 2, 2001, which is incorporated herein by reference in its entirety. Additionally the source material 102 may be heated or 'baked' at a predetermined temperature prior to reaction. In one embodiment, the source material 102 is baked to a temperature of between about 500° C. and about 1600° C. in a nitrogen-containing atmosphere, such as ammonia or a mixture of inert gas, such as He, Ne, Ar, or Kr, and at least one of ammonia and nitrogen.

The solid source material 102 is brought into contact with a flux material 106. The flux material 106 is a solid at about 30° C. and comprises at least one of nitrides, amides, metal halides, urea and derivatives thereof, azides, ammonium salts, alkaline earth fluoronitrides, and combinations thereof. In one embodiment, the flux material 106 comprises at least one metal halide, wherein the metal halide is one of an alkali metal halide and an alkaline earth halide. Nitrides that may be used as the flux material 106 include, but are not limited to, lithium nitride ($Li_3N$), magnesium nitride ($Mg_3N_2$), calcium nitride ($Ca_3N_2$) and copper nitride ($CuN_x$). Amides that may be used as flux material include, but are not limited to, lithium amide ($LiNH_2$), sodium amide ($NaNH_2$), and potassium amide ($KNH_2$). Among the azides that are suitable for use as flux material 106 is sodium azide ($NaN_3$). Ammonium salts that may be used as the flux material 106 include, but are not limited to, ammonium fluoride ($NH_4F$), ammonium chloride ($NH_4Cl$), ammonium bromide ($NH_4Br$), and ammonium iodide ($NH_4I$). Alkaline earth fluoronitrides that may be used as the flux material 106 include, but are not limited to, Mg2NF, Mg3NF3, and Ca2NF. Alternatively, the flux material 106 may comprise compounds formed by reaction of the aforementioned flux materials with reagents containing at least one Group III metal (e.g., $GaCl_3$). In one embodiment, the flux material 106 is baked at a temperature of between about 80° C. and about 1200° C. in an oxygen-free atmosphere, such as vacuum, at least one inert gas, such as He, Ne, Ar, or Kr, and at least one of ammonia and nitrogen. In order to more efficiently use the limited space within reaction vessel 100, flux material 106 may additionally be densified and consolidated by cold pressing or hot pressing.

In one embodiment, the source material 102 may be brought into contact with the flux material 106 by first mixing both materials together and pressing the mixture into a pill. One or more well-defined crystals of a Group III metal nitride may also be added to the mixture to serve as seed crystals for the crystal growth process. The source material/flux material pill is placed in a reaction vessel 100 and processed under high pressure and high temperature (also referred to hereinafter as "HPHT") conditions. HPHT conditions include processing pressures and temperatures ranging from about 1 atm to about 80 kbar, and from about 500 to about 3000° C., respectively. Under HPHT conditions, some or all of the source material 102 dissolves in the flux material 106. Ostwald ripening occurs, as large and well-crystallized Group III metal nitride crystals grow while smaller and less-well-crystallized crystals of the Group III metal nitride shrink. Additional single crystals of the Group III metal nitride may precipitate from the flux material 106 upon cooling of the reaction vessel 100.

In another embodiment, shown in FIG. 1, source material 102 is placed in one end of reaction vessel 100, at least one crystalline Group III metal nitride seed 104 is placed in the opposite end of the reaction vessel 100, and flux material 106 is placed between source material 102 and crystalline Group III metal nitride seed 104. In yet another embodiment, a non-Group III metal nitride seed (i.e., a seed material other than a Group III metal nitride) is placed in reaction vessel 100 in the end opposite source material 102. The non-Group III metal nitride seed should have a lattice constant within about 20% of that of the Group III metal nitride crystal to be grown. More preferably, the non-Group III metal nitride seed has a lattice constant within about 5% of that of the Group III metal nitride crystal to be grown. In the case of GaN or AlN, for example, silicon carbide or sapphire may be employed as a seed crystal. The seed is not limited to Group III metal nitride and could be single silicon carbide and sapphire. A portion of flux 106 may optionally be mixed with source material 102.

In one embodiment, a baffle 110 separates source material 102 from the main body of flux 106. Fluid communication between source material 102 and the main body of flux 106 is provided by through holes (not shown) included in baffle 110. Baffle 110 with through holes has a fractional open area in the range of between about 1% and about 40%. In order to prevent dissolution of the crystalline Group III metal nitride seed 104 prior to the onset of growth, a diffusion barrier 108, such as, but not limited to, a thin foil of a suitable material, such as platinum, tantalum, and the like, may be provided to protect the crystalline Group III metal nitride seed 104. The crystalline Group III metal nitride seed 104 may either be wrapped within diffusion barrier 108, or diffusion barrier 108 may be positioned to separate the seed and a small quantity of flux material 106 from the main body of flux material 106.

Positioning of source material 102, flux material 106, and crystalline Group III metal nitride seed 104 within reaction vessel 100 depends upon the relative densities of these materials. For example, gallium nitride has a density of about 6.1 g/cc. If, under GaN growth conditions, the density of flux material 106 is greater than that of GaN, any spontaneously nucleated GaN crystals will float upward. In this case, source material 102 would be optimally arranged in the top of reaction vessel 100 and crystalline Group III metal nitride (GaN) seed crystal 104 with the seed crystal would be optimally arranged in the bottom of reaction vessel 100, as shown in FIG. 1. If, conversely, flux material 106, under growth conditions, has a density less than that of GaN, any spontaneously-nucleated GaN crystals will sink to the bottom of reaction vessel 100. Here the arrangement of source material 102 and crystalline Group III metal nitride (GaN) seed 104 is inverted from that shown in FIG. 1; i.e., with crystalline Group III metal nitride (GaN) seed 104 located at the top of reaction vessel 100.

The source material 102, flux 106, at least one crystalline Group III metal nitride seed 104, and, if included, baffle 110 and diffusion barrier 108 are enclosed within a reaction vessel 100, which is sealable and impermeable with respect to nitrogen. Reaction vessel 100 is also chemically inert with respect to both source material 102 and flux 106 under crystal growth conditions. Once filled and sealed, reaction vessel 100 may undergo a passivation reaction with other cell components such as, for example, source material 102, and/or flux 106. Such passivation reactions are permissible as long as reaction vessel 100, following passivation, is sealable, impermeable to nitrogen, and inert to further chemical reaction.

Reaction vessel 100 comprises at least one layer and may additionally include at least one liner 112 and at least one coating 114. Each of reaction vessel 100, baffle 110, liner 114, and at the least one coating 112 comprises at least one of: copper; silver; gold; platinum; palladium; iridium; rhodium; ruthenium; osmium; rhenium; iron; nickel; phosphorus; $MC_x N_y O_z$, wherein M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and wherein $0 \leq x, y,$ and $z \leq 3$; and combinations thereof; pyrophyllite; talc; olivine; calcium carbonate; merylinite clay; bentonite clay; and sodium silicate. Liner 114 and the at least one coating 112 typically comprise a material that is different from that (or those) used to form reaction vessel 100. In one embodiment, reaction vessel 100 has a melting point of greater than 1600° C. Reaction vessel 100 may be gas tight upon initial filling and sealing, or may become gas tight during processing at high pressure and high temperature.

Once filled and sealed, reaction vessel 100 is then placed into a reaction cell 120, as shown in FIG. 1. In one embodiment, reaction cell 120 includes a heating element 124 and a pressure transmission medium 122. Heating element 124 comprises at least one of graphite, nichrome, niobium, titanium, tantalum, stainless steel, nickel, chromium, zirconium, molybdenum, tungsten, rhenium, hafnium, platinum, silicon carbide, and combinations thereof. Heating element 124 may take the form of a resistively heated tube, foil, ribbon, bar, wire, or combinations thereof. Pressure transmission medium 122 is thermally stable at least up to the temperature at which crystal growth of the Group III metal nitride takes place. During HPHT processing, pressure transmission medium 122 preferably remains a solid with a relatively low shear strength and internal friction. Pressure transmission medium 122, for example, has an internal friction below about 0.2. In one embodiment, pressure transmission medium 122 comprises at least one alkali halide, such as NaCl, NaBr, or NaF. Alternatively, transmission medium 122 may comprise at least one of talc, pyrophyllite, molybdenum disulfide, graphite, hexagonal boron nitride, silver chloride, calcium fluoride, strontium fluoride, calcium carbonate, magnesium oxide, zirconium oxide, merylinite clay, bentonite clay, and sodium silicate.

Reaction cell 120 containing reaction vessel 100 is then placed in a high pressure apparatus (not shown). In one embodiment, the high pressure apparatus comprises a belt-type apparatus, with a reinforced die and at least two punches or anvils. Alternatively, the high pressure apparatus may comprise one of a piston press, a multi-anvil press with at least four anvils, a toroid-type apparatus with two recessed anvils, and a split-sphere apparatus.

Figure 2:
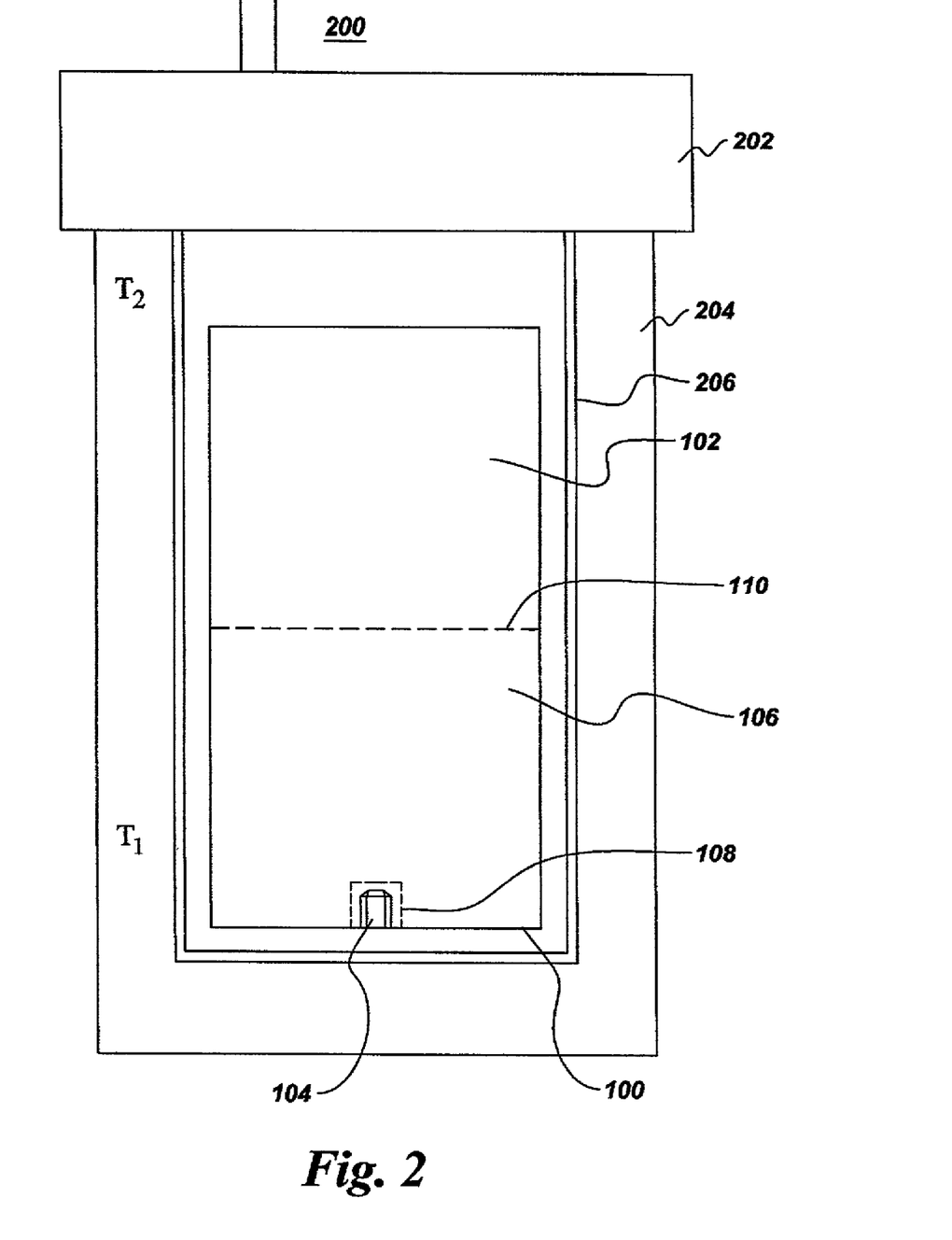
FIG. 2 is a schematic representation of a cross-section of a reaction vessel of the present invention disposed in an autoclave.

In yet another embodiment, shown in FIG. 2, the pressure apparatus comprises an autoclave 200 such as, but not limited to, a Morey autoclave, a Tuttle/Roy cold-cone seal autoclave, a modified Bridgman autoclave, a full Bridgman autoclave, a delta ring autoclave, and a Walker-Buehler type autoclave. The at least one Group III metal nitride seed 104, flux 106, and source material 102 are placed in autoclave 200. In one embodiment, a baffle 110 separates source material 102 and the region containing the at least one Group III metal nitride seed 104. In one embodiment, the at least one Group III metal nitride seed 104, flux 106, source material 102, and baffle 110 are placed in reaction vessel 100 prior to insertion into autoclave 200. Reaction vessel 100 and baffle 110 each comprise at least one of: copper; silver; gold; platinum; palladium; iridium; rhodium; ruthenium; osmium; rhenium; iron; nickel; phosphorus; MC x N yO z, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and combinations thereof, and where $0 \leq x$, y, and $z \leq 3$; pyrophyllite; talc; olivine; calcium carbonate; merylinite clay; bentonite clay; and sodium silicate. In one embodiment, reaction vessel 100 has a melting point of greater than 1600° C. Reaction vessel 100 may be gas tight upon initial filling and sealing, or may become gas tight during processing at high pressure and high temperature. Optionally, an outer liner 206 may be inserted into autoclave 200 to improve chemical inertness.

Once sealed, reaction vessel 100 is processed under HPHT conditions. Processing pressures and temperatures ranges from about 1 atm to about 80 kbar, and from about 500° C. to about 3000° C., respectively. The solubility of the Group III metal nitrides in most fluxes generally increases as a function of temperature. In this case, the end of reaction vessel 100 containing source material 102 is maintained at a higher temperature ($T_2$ in FIGS. 1 and 2) during processing at HPHT than the end of reaction vessel 100 containing the at least one Group III metal nitride seed 104. If the solubility of the Group III metal nitride in flux 106 decreases as a function of temperature, the end of reaction vessel 100 containing source material 102 is maintained at a lower temperature ($T_2$ in FIGS. 1 and 2) during processing at HPHT than the end of reaction vessel 100 containing the at least one Group III metal nitride seed 104. The difference in temperature between source 102 ($T_2$) and the at least one Group III metal nitride seed 104 ($T_1$ in FIGS. 1 and 2) is between about 5° C. and about 300° C. Under HPHT conditions, the source material dissolves in the flux material and is transported through the flux to the crystalline GaN seed. Because the Group III metal nitride solubility at the end of reaction vessel 100 containing source material 102 is greater than at the end of reaction vessel 100 containing the at least one Group III metal nitride seed 104, the concentration of dissolved Group III metal nitride decreases in the direction from source 102 to the at least one Group III metal nitride seed 104. As a result of this difference in solubility, the Group III metal nitride diffuses from source material 102 through flux 106 to the at least one Group III metal nitride seed 104, where the Group III metal nitride precipitates onto the at least one Group III metal nitride seed 104 to form a large single crystal, or boule, of the Group III metal nitride.

The temperature gradient may be achieved in the apparatus of FIG. 1 by locating one end of reaction vessel 100 asymmetrically within the heating zone of the HPHT reaction cell 120. Alternatively—or in addition to locating reaction vessel 100 asymmetrically in reaction cell 120—the temperature gradient may be produced by providing a heating element 124 having a non-uniform resistivity along its length. Non-uniform resistivity may be achieved by providing a heating element 124 having at least one of a non-uniform thickness, perforations at selected points, and a laminate structure of at least two materials of differing resistivity at selected points along its length. In one embodiment, at least two independent temperature sensors (not shown) are provided to measure and control the temperature gradient between the opposite ends of reaction vessel 100. The temperature difference may also be achieved by either providing an auxiliary heater (not shown) proximate to one end of reaction vessel 100, or by differentially cooling one end of reaction vessel 100, for example, by providing a coolant at different temperatures to the two ends of the apparatus. In addition, the temperature difference may also be achieved by altering the cooling conditions at the top of apparatus and the bottom of apparatus. The temperature gradient may be adjusted during the single crystal growth to optimize quality and growth rate.

The reaction vessel shown in FIG. 2 may be heated by means of at least one heating element 224 or a furnace external to the outer wall of autoclave 200. The desired temperature gradient may be achieved by means of two or more hot zones within the furnace.

In another embodiment, source material 102, comprising at least one of amorphous or polycrystalline Group III metal nitride powder, such as, for example, GaN, is pressed into a pill. A flux material 106, such as, for example, but not limited to, $NaN_3$, is pressed separately into a sleeve and placed around the pill such that the sleeve makes contact with the pill. The pill and surrounding sleeve are then placed inside reaction vessel 100. The presence of the nitrogen-containing flux material 106 maintains the chemical potential of nitrogen within the reaction vessel at a sufficiently high level in order to obtain stoichiometric Group III metal nitride, such as AlN, InN, and GaN. For growth of InN and GaN crystals, the reaction vessel is then pressurized to between about 55 and about 80 kbar and heated to a temperature of between about 1200° C. and about 3000° C. The temperature is sufficient to melt the source material 102 at one end of the reaction vessel ($T_2$ in FIGS. 1 and 2), while the pressure is sufficient to inhibit decomposition. The approximate melting point of AlN is about 3200° C., and the nitrogen ($N_2$) pressure needed to inhibit decomposition is about 0.2 kbar. For GaN, the approximate melting point is about 2500° C., and the nitrogen ($N_2$) pressure needed to inhibit decomposition is about 45 kbar. The approximate melting point of InN is about 1900° C., and the nitrogen ($N_2$) pressure needed to inhibit decomposition is about 60 kbar. During processing at HPHT, one end of reaction vessel 100 is maintained at a higher temperature ($T_2$ in FIGS. 1 and 2) than the opposite end of reaction vessel 100 ($T_1$ in FIGS. 1 and 2), with the difference in temperature being between about 5° C. and about 300° C. After being held for a predetermined time at HPHT, reaction vessel 100 is cooled at a predetermined cooling rate of between about 0.02° C./hr to about 100° C./hr so that a single GaN crystal nucleates at the "cold"—or low temperature ($T_1$ in FIGS. 1 and 2)—end of reaction vessel 100. The remaining molten Group III metal nitride then crystallizes onto the single nucleated crystal as the entire reaction vessel 100 cools below the melting point of the Group III metal nitride. Group III metal nitride seed 104 may optionally be located at the low temperature end of reaction vessel to provide a nucleation site. A similar procedure may be used to obtain single crystals of other Group III metal (i.e., Al, In, and combinations of Ga, Al, and In) nitrides.

After processing at HPHT conditions for a predetermined time, reaction vessel 100 is cooled and the pressure on reaction vessel 100 is released. Reaction vessel 100 is disassembled and the Group III metal nitride single crystals are removed, typically by washing the interior of reaction vessel 100 with mineral acids such as HCl and $HNO_3$.

The following examples serve to illustrate the features and advantages offered by the present invention, and are not intended to limit the invention thereto.

EXAMPLE 1

Commercial grade GaN powder, having a nominal purity of 99.9%, was mixed with lithium nitride ($Li_3N$) powder in a 6:1 ratio by weight. The mixed powders were pressed into a pill, wrapped in tantalum foil, and placed inside a magnesium oxide outer capsule reaction vessel. The encapsulated powders were then placed in a cell and pressed at about 50 kbar and about 1500° C. in a belt-type press apparatus for about 15 minutes. The reaction vessel was then cooled and opened. The GaN crystals were separated from the lithium nitride flux material by washing with water and $HNO_3$. The GaN crystals were approximately 20 microns in size. X-ray diffraction patterns obtained for the GaN starting material and the GaN crystals that were grown under HPHT conditions are compared in Table 1. The x-ray diffraction pattern obtained for the GaN crystals grown under HPHT conditions included diffraction peaks not observed in the starting material and significantly greater peak heights than the x-ray diffraction pattern obtained for the GaN starting material, indicating that the GaN crystals grown under HPHT conditions had a significantly higher degree of crystallinity than the GaN starting material.

EXAMPLE 2

Figure 3:
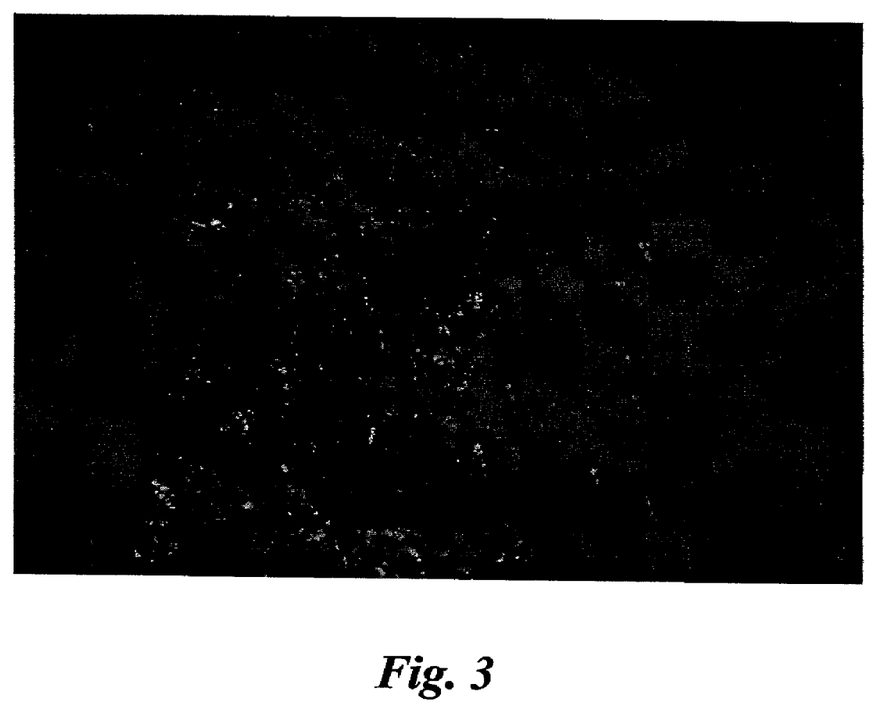
FIG. 3 is a photograph of gallium nitride (GaN) crystals grown by the method of the present invention.

Commercially available gallium nitride powder, having the same nominal purity and relatively poor crystallinity as described in Example 1, was compacted into a pill weighing about 1.4 g. Ammonium iodide ($NH_4I$) powder was compacted into a second pill, weighing 2.6 g. The two pills were placed into a reaction vessel comprising two opposing cups fabricated from hot-pressed boron nitride. The reaction vessel was then placed within a cell and treated at high pressure and high temperature in a temperature gradient cell in a belt-type press apparatus. The pressure was approximately 30 kbar. The temperature of the top of the cell was about 1435° C., and the temperature at the bottom of the cell was about 1360° C. After a treatment time of about 20 hours, the cell was cooled and removed from the press. Residual $NH_4I$ was washed out of the cell with water, leaving residual GaN powder and well-crystallized GaN crystals, having an average diameter of about 0.5 mm, which are shown in FIG. 3. X-ray diffraction studies confirmed that the crystals are pure gallium nitride.

EXAMPLE 3

Gallium nitride powder was compacted into a pill weighing about 1.25 g. A second pill was compacted from a mixture comprising about 2.6 g of ammonium iodide ($NH_4I$.) powder and about 0.1 g GaN powder. The two pills were placed into a reaction vessel comprising two opposing cups fabricated from hot-pressed boron nitride. The reaction vessel was then placed within a cell and treated at high pressure and high temperature in a temperature gradient cell in a belt-type press apparatus. The pressure was approximately 40 kbar. The temperature of the top of the cell was about 1450° C., and the temperature at the bottom of the cell was about 1375° C. After a treatment time of 24 hr, the cell was cooled and removed from the press. Residual $NH_4I$ was washed out of the cell with water, leaving residual GaN powder and well-crystallized GaN crystals.

EXAMPLE 4

Gallium nitride powder was compacted into a pill weighing about 1.25 g. A second pill was compacted from a mixture comprising about 2.4 g of ammonium bromide ($NH_4Br$) powder and about 0.1 g. GaN powder. The two pills were placed into a reaction vessel comprising two opposing cups fabricated from hot-pressed boron nitride. The reaction vessel was then placed within a cell and treated at high pressure and high temperature in a temperature gradient cell in a belt-type press apparatus. The pressure was approximately 40 kbar. The temperature of the top of the cell was about 1330° C., and the temperature at the bottom of the cell was about 1255° C. After a treatment time of about 16 hr, the cell was cooled and removed from the press. Residual $NH_4Br$ was washed out of the cell with water, leaving residual GaN powder and GaN crystals.

EXAMPLE 5

Gallium nitride powder was compacted into a pill weighing about 1.25 g. A second pill was compacted from a mixture comprising about 2.6 g of ammonium iodide ($NH_4I$) powder and about 0.1 g GaN powder. A single crystal of SiC, 1 mm×1 mm×0.2 mm, served as a seed. The two pills were separated by a tungsten baffle and then placed into a reaction vessel comprising two opposing cups fabricated from hot-pressed boron nitride. The reaction vessel was then placed within a cell and treated at high pressure and high temperature within a temperature gradient cell, which was placed in a belt-type press apparatus. The pressure was approximately 40 kbar. The temperature of the top of the cell was about 1450° C., and the temperature at the bottom of the cell was about 1375° C. After a treatment time of 30 hr, the cell was cooled and removed from the press. Residual $NH_4I$ was washed out of the cell with water, leaving residual GaN powder and 200 micrometer well-crystallized GaN crystals.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

Table 1. X-Ray diffraction patterns obtained for GaN starting material and GaN crystals were grown under HPHT conditions.

| GaN Starting Material | | GaN Grown under HPHT | |
| --- | --- | --- | --- |
| d spacing (angstroms) | Peak Height Arbitrary units | d spacing (angstroms) | Peak Height Arbitrary units |
| 2.7571 | 491 | 2.7551 | 1614 |
|  |  | 2.5882 | 1310 |
|  |  | 2.4339 | 1505 |
| 2.4385 | 560 | 1.8872 | 427 |
|  |  | 1.5925 | 913 |
|  |  | 1.4633 | 609 |
|  |  | 1.3784 | 132 |
|  |  | 1.3566 | 376 |
|  |  | 1.3332 | 482 |
|  |  | 1.2953 | 117 |
|  |  | 1.2181 | 148 |
|  |  | 1.1719 | 69 |
|  |  | 1.0779 | 156 |
|  |  | 1.0432 | 121 |
|  |  | 1.0226 | 250 |

The invention claimed is:

1. A method of forming at least one single crystal of a Group III metal nitride, the method comprising the steps of:
   a) providing a source material to a reaction vessel, wherein the source material comprises at least one Group III metal compound selected from the group consisting of compounds of aluminum, compounds of indium, and compounds of gallium, and wherein the reaction vessel has an inner chamber and is sealable with respect to nitrogen and ammonia and chemically inert;
   b) providing a flux material to the reaction vessel, wherein the flux material is a solid at about 30° C. and consists essentially of at least one of a nitride, an amide, a metal halide, urea, a derivative of urea, an ammonium salt, an alkaline earth fluoronitride, and combinations thereof;
   c) sealing the reaction vessel to provide a sealed reaction vessel comprising a reactant mixture consisting essentially of the source material provided in step a) and the flux material provided in step b);
   d) heating the reaction vessel to a predetermined temperature that is sufficient to decompose the Group III metal nitride and also applying a predetermined pressure to the vessel, wherein the predetermined pressure is sufficient to suppress decomposition of the Group III metal nitride at the predetermined temperature, and wherein the flux material dissolves at least a portion of the source material; and
   e) forming at least one single crystal of the Group III metal nitride.

2. The method according to claim 1, wherein the step of heating the reaction vessel to a predetermined temperature and applying a predetermined pressure to the vessel comprises heating a first end of the reaction vessel to a first temperature and a second end of the reaction vessel opposite the first end to a second temperature, wherein the first temperature is different from the second temperature, and wherein the source material is located within the first end of the reaction vessel.

3. The method according to claim 2, wherein the first temperature is different from the second temperature by between about 5° C. and about 300° C.

4. The method according to claim 2, wherein the step of heating a first end of the reaction vessel to a first temperature and a second end of the reaction vessel opposite the first end to a second temperature comprises the step of positioning the reaction vessel in a furnace, wherein the first end is located in a first zone having a first temperature and the second end is located in a second zone having a second temperature.

5. The method according to claim 2, wherein the step of heating a first end of the reaction vessel to a first temperature and a second end of the reaction vessel opposite the first end to a second temperature comprises the step of differentially heating the first end to a first temperature and the second end to a second temperature.

6. The method according to claim 2, wherein the step of heating a first end of the reaction vessel to a first temperature and a second end of the reaction vessel opposite the first end to a second temperature comprises the step of heating the first end and the second end to the predetermined temperature and differentially cooling the first end to a first temperature and the second end to a second temperature.

7. The method according to claim 1, wherein the step of providing a source material to a reactor vessel further includes the step of baking the source material to a predetermined baking temperature prior to providing the source material to the reaction vessel.

8. The method according to claim 7, wherein the step of baking the source material to a predetermined baking temperature comprises heating the source material to a temperature of between about 500° C. and about 1600° C. in an atmosphere comprising ammonia or a nitrogen-containing gas.

9. The method according to claim 1, wherein the step of providing a source material to a reactor vessel further includes the step of densifying the source material prior to providing the source material to the reaction vessel.

10. The method according to claim 9, wherein the step of densifying the source material comprises cold pressing the source material at a predetermined pressure to form a pill.

11. The method according to claim 1, wherein the step of providing a source material to a reactor vessel comprises providing a source material comprising at least one Group III metal nitride powder.

12. The method according to claim 1, wherein the step of providing a source material to a reactor vessel comprises providing a source material comprising at least one Group III metal in elemental form.

13. The method according to claim 1, wherein the step of providing a source material to a reactor vessel comprises providing a source material comprising at least one Group III metal-containing compound, wherein the at least one Group III metal-containing compound is a compound other than the Group III metal nitride.

14. The method according to claim 13, wherein the at least one Group III metal containing compound comprises at least one Group III metal halide.

15. The method according to claim 1, wherein the step of providing a source material to a reactor vessel comprises providing a source material comprising the Group III metal nitride in polycrystalline form.

16. The method according to claim 1, wherein the step of providing a source material to a reactor vessel comprises providing a source material comprising the Group III metal nitride in amorphous form.

17. The method according to claim 1, wherein the step of providing a source material to a reactor vessel comprises providing a source material comprising the Group III metal nitride in sintered form.

18. The method according to claim 1, wherein the step of providing a flux material to the reactor vessel comprises providing a flux material to an end of the reactor vessel opposite the source material.

19. The method according to claim 1, wherein the step of providing a flux material to the reactor vessel comprises providing a flux material to the reactor vessel such that the flux material contacts the source.

20. The method according to claim 1, wherein the step of providing a flux material to a reactor vessel further includes the step of baking the flux material to a predetermined baking temperature prior to providing the flux material to the reaction vessel.

21. The method according to claim 20, wherein the step of baking the flux material to a predetermined baking temperature comprises heating the flux material to a temperature of between about 80° C. and about 1200° C. in an oxygen-free atmosphere.

22. The method according to claim 1, wherein the step of providing a flux material to a reactor vessel further includes the step of densifying the flux material prior to providing the flux material to the reaction vessel.

23. The method according to claim 1, wherein the step of heating the reaction vessel to a predetermined temperature and applying a predetermined pressure to the vessel further comprises the step of positioning the reaction vessel in a furnace.

24. The method according to claim 1, wherein the step of heating the reaction vessel to a predetermined temperature and applying a predetermined pressure to the vessel comprises heating the reaction vessel to a temperature of between about 500° C. and about 3000° C. and applying a predetermined pressure to the vessel.

25. The method according to claim 24, wherein the step of heating the reaction vessel to a temperature of between about 500° C. and about 3000° C. and applying a predetermined pressure to the vessel comprises heating the reaction vessel to a temperature of between about 1000° C. and about 1600° C. and applying a predetermined pressure to the vessel.

26. The method according to claim 1, wherein the step of heating the reaction vessel to a predetermined temperature and applying a predetermined pressure to the vessel comprises heating the reaction vessel to a predetermined temperature and applying a pressure of between about 1 atmosphere and about 80 kbar to the vessel.

27. The method according to claim 26, wherein the step of heating the reaction vessel to a predetermined temperature and applying a pressure of between about 1 atmosphere and about 80 kbar to the vessel comprises heating the reaction vessel to a predetermined temperature and applying a pressure of between about 2 kbar and about 80 kbar to the vessel.

28. The method according to claim 1, wherein the reaction vessel comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

29. The method according to claim 28, wherein the reaction vessel comprises at least one of boron nitride, magnesia, alumina, zirconia, tungsten, yttria, and iridium.

30. The method according to claim 1, wherein the reaction vessel further comprises a liner, wherein the liner comprises a material different from the reaction vessel and is insertable within the reaction vessel.

31. The method according to claim 30, wherein the liner comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

32. The method according to claim 30, wherein the liner has a thickness of between about 10 microns and about 5 mm.

33. The method according to claim 1, wherein the reaction vessel further comprises at least one coating disposed on an inner surface of the reaction vessel, wherein the at least one coating comprises a material different from that of the reaction vessel.

34. The method according to claim 33, wherein the at least one coating comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

35. The method of claim 33, wherein the at least one coating has a thickness of between about 0.5 micron and about 250 microns.

36. The method according to claim 1, wherein the step of providing a source material to a reaction vessel comprises providing a source material to a reaction vessel having a melting point of greater than about 1600° C.

37. The method according to claim 1, wherein the reaction vessel further includes a baffle separating the inner chamber of the reaction vessel into a first section and a second section, the baffle having a plurality of apertures therethrough, wherein the apertures place the first section and second section in fluid communication with each other.

38. The method according to claim 37, wherein the baffle comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

39. The method according to claim 37, wherein the baffle has a fractional open area between about 1% and about 40%.

40. The method according to claim 1, wherein the step of forming at least one single crystal of the Group III metal nitride comprises the steps of providing a seed crystal of the Group III metal nitride to the reaction vessel and depositing a single crystal of the Group III metal nitride on the seed crystal.

41. The method according to claim 1, wherein the step of forming at least one single crystal of the Group III metal nitride comprises the steps of providing a seed crystal of a material having a lattice mismatch of less than about 20% with respect to the Group III metal nitride to the reaction vessel and depositing a single crystal of the Group III metal nitride on the seed crystal.

42. The method according to claim 41, wherein the lattice mismatch of less than about 5% with respect to the Group III metal nitride.

43. The method according to claim 41, wherein the seed crystal comprises one of silicon carbide and sapphire.

44. The method according to claim 1, wherein the step of forming at least one single crystal of the Group III metal nitride comprises the steps of spontaneously nucleating the Group III metal nitride within the reaction vessel and depositing at least one single crystal of the Group III metal nitride on the spontaneously nucleated Group III metal nitride.

45. A method of dissolving a source material for a Group III metal nitride in a flux material, the method comprising the steps of:
 a) providing the source material to a reaction vessel, wherein the source material comprises at least one Group III metal compound selected from the group consisting of compounds of aluminum, compounds of indium, and compounds of gallium, and wherein the reaction vessel is sealable with respect to nitrogen and is chemically inert;
 b) providing a flux material to the reaction vessel, wherein the flux material is a solid at about 30° C. and consists essentially of at least one of a nitride, an amide, a metal halide, urea, a derivative of urea, an ammonium salt, an alkaline earth fluoronitride, and combinations thereof;
 c) sealing the reaction vessel to provide a sealed reaction vessel comprising a reactant mixture consisting essentially of the source material provided in step a) and the flux material provided in step b);
 d) heating the reaction vessel to a predetermined temperature that is sufficient to decompose the Group III metal nitride and also applying a predetermined pressure to the vessel, wherein the predetermined pressure is sufficient to suppress decomposition of the Group III metal nitride at the predetermined temperature;
 e) melting the flux material; and
 f) dissolving at least a portion of the source material in the flux material.

46. The method according to claim 45, wherein the step of providing a source material to a reactor vessel comprises providing a source material comprising the Group III metal nitride in powder form.

47. The method according to claim 45, wherein the step of providing a source material to a reactor vessel comprises providing a source material comprising the at least one Group III metal in elemental form.

48. The method according to claim 45, wherein the step of providing a source material to a reactor vessel comprises providing a source material comprising at least one Group III metal-containing compound, wherein the at least one Group III metal-containing compound is a compound other than the Group III metal nitride.

49. The method according to claim 48, wherein the at least one Group III metal-containing compound comprises at least one Group III metal halide.

50. The method according to claim 45, wherein the step of providing a source material to a reactor vessel comprises providing a source material comprising the Group III metal nitride in polycrystalline form.

51. The method according to claim 45, wherein the step of providing a source material to a reactor vessel comprises providing a source material comprising the Group III metal nitride in amorphous form.

52. The method according to claim 45, wherein the step of providing a source material to a reactor vessel comprises providing a source material comprising the Group III metal nitride in sintered form.

53. A method of forming at least one single crystal of a Group III metal nitride, the method comprising the steps of:
 a) providing a source material to a reaction vessel, wherein the source material comprises at least one Group III metal selected from the group consisting of compounds of aluminum, compounds of indium, and compounds of gallium, and wherein the reaction vessel has an inner chamber and is sealable with respect to nitrogen and chemically inert;
 b) providing a flux material to the reaction vessel, wherein the flux material is a solid at about 30° C. and consists essentially of at least one of a nitride, an amide, a metal halide, urea, a derivative of urea, an ammonium salt, an alkaline earth fluoronitride, and combinations thereof, and wherein the flux material is capable of dissolving at least a portion of the source material;
 c) sealing the reaction vessel to provide a sealed reaction vessel comprising a reactant mixture consisting essentially of the source material provided in step a) and the flux material provided in step b); and heating a first end of the reaction vessel to a first temperature that is sufficient to decompose the Group III metal nitride, and heating a second end of the reaction vessel opposite the first end to a second temperature that is sufficient to decompose the Group III metal nitride;
 d) applying a predetermined pressure to the vessel, wherein the predetermined pressure is sufficient to suppress decomposition of the Group III metal nitride at the second temperature;
 e) melting the flux material;
 f) dissolving at least a portion of the source material in the flux material; and
 g) forming at least one single crystal of the Group III metal nitride in the second end of the reaction vessel.

54. The method according to claim 53, wherein the first temperature is different by between about 5° C. and about 300° C.

55. The method according to claim 53, wherein the step of heating a first end of the reaction vessel to a first temperature and a second end of the reaction vessel opposite the first end to a second temperature comprises the step of positioning the reaction vessel in a furnace, wherein the first end is located in a first zone having a first temperature and the second end is located in a second zone having a second temperature.

56. The method according to claim 53, wherein the step of heating a first end of the reaction vessel to a first temperature and a second end of the reaction vessel opposite the first end to a second temperature comprises the step of differentially heating the first end to a first Temperature and the second end to a second temperature.

57. The method according to claim 53, wherein the step of heating a first end of the reaction vessel to a first temperature and a second end of the reaction vessel opposite the first end to a second temperature comprises the step of heating the first end and the second end to the predetermined temperature and differentially cooling the First end to a first temperature and the second end to a second temperature.

58. The method according to claim 53, wherein the step of providing a source material to a reactor vessel further includes the step of baking the source material to a predetermined baking temperature prior to providing the source material to the reaction vessel.

59. The method according to claim 58, wherein the step of baking the source material to a predetermined baking temperature comprises heating the source material to a temperature of between about 500° C. and about 1600° C. in an atmosphere comprising ammonia or a nitrogen-containing gas.

60. The method according to claim 53, wherein the step of providing a source material to a reactor vessel further includes the step of densifying the source material prior to providing the source material to the reaction vessel.

61. The method according to claim 60, wherein the step of densifying the source material comprises cold pressing the source material at a predetermined pressure to form a pill.

62. The method according to claim 53, wherein the step of providing a source material to a reactor vessel comprises providing a source material comprising the Group III metal nitride in powder form.

63. The method according to claim 53, wherein the step of providing a source material to a reactor vessel comprises providing a source material comprising the at least one Group III metal in elemental form.

64. The method according to claim 53, wherein the step of providing a source material to a reactor vessel comprises providing a source material comprising at least one Group III metal-containing compound, wherein the at least one Group III metal-containing compound is a compound other than the Group III metal nitride.

65. The method according to claim 64, wherein the at least one Group III metal-containing compound comprises at least one Group III metal halide.

66. The method according to claim 53, wherein the step of providing a source material to a reactor vessel comprises providing a source material comprising the Group III metal nitride in polycrystalline form.

67. The method according to claim 53, wherein the step of providing a source material to a reactor vessel comprises providing a source material comprising the Group III metal nitride in amorphous form.

68. The method according to claim 53, wherein the step of providing a source material to a reactor vessel comprises providing a source material comprising the Group III metal nitride in sintered form.

69. The method according to claim 53, wherein the step of providing a flux material to the reactor vessel comprises providing a flux material to an end of the reactor vessel opposite the source material.

70. The method according to claim 53, wherein the step of providing a flux material to the reactor vessel comprises providing a flux material to the reactor vessel such that the flux material contacts the source.

71. The method according to claim 53, wherein the step of providing a flux material to a reactor vessel further includes the step of baking the flux material to a predetermined baking temperature prior to providing the flux material to the reaction vessel.

72. The method according to claim 71, wherein the step of baking the flux material to a predetermined baking temperature comprises heating the flux material to a temperature of between about 80° C. and about 1200° C. in an oxygen-free atmosphere.

73. The method according to claim 53, wherein the step of providing a flux material to a reactor vessel further includes the step of densifying the flux material prior to providing the flux material to the reaction vessel.

74. The method according to claim 53, wherein the step of heating the reaction vessel to a predetermined temperature and applying a predetermined pressure to the vessel further comprises the step of positioning the reaction vessel in a furnace.

75. The method according to claim 53, wherein the step of heating the reaction vessel to a predetermined temperature and applying a predetermined pressure to the vessel comprises heating the reaction vessel to a temperature of between about 500° C. and about 3000° C. and applying a predetermined pressure to the vessel.

76. The method according to claim 75, wherein the step of heating the reaction vessel to a temperature of between about 500° C. and about 3000° C. and applying a predetermined pressure to the vessel comprises heating the reaction vessel to a temperature of between about 1000° C. and about 1600° C. and applying a predetermined pressure to the vessel.

77. The method according to claim 53, wherein the step of heating the reaction vessel to a predetermined temperature and applying a predetermined pressure to the vessel comprises heating the reaction vessel to a predetermined temperature and applying a pressure of between about 1 atmosphere and about 80 kbar to the vessel.

78. The method according to claim 77, wherein the step of heating the reaction vessel to a predetermined temperature and applying a pressure of between about 1 atmosphere and about 80 kbar to the vessel comprises heating the reaction vessel to a predetermined temperature and applying a pressure of between about 2 kbar and about 80 kbar to the vessel.

79. The method according to claim 53, wherein the reaction vessel comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$; and combinations thereof; pyrophyllite, talc, olivine, calcium carbonate, merylinite clay, bentonite clay, and sodium silicate.

80. The method according to claim 79, wherein the reaction vessel comprises at least one of boron nitride, magnesia, alumina, zirconia, tungsten, yttria, and iridium.

81. The method according to claim 53, wherein the reaction vessel further comprises a liner, wherein the liner comprises a material different from the reaction vessel and is insertable within the reaction vessel.

82. The method according to claim 81, wherein the liner comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

83. The method according to claim 81, wherein the liner has a thickness of between about 10 microns and about 5 mm.

84. The method according to claim 53, wherein the reaction vessel further comprises at least one coating disposed on an inner surface of the reaction vessel, wherein the at least one coating comprises a material different from that of the reaction vessel.

85. The method according to claim 84, wherein the at least one coating comprises at least one of copper, silver, gold, platinum, palladium, iridium, rhodium, ruthenium, osmium, rhenium, iron, nickel, phosphorus, $MC_xN_yO_z$, where M is at least one metal selected from magnesium, calcium, strontium, barium, aluminum, boron, silicon, titanium, vanadium, chromium, yttrium, zirconium, lanthanum, a rare earth metal, hafnium, tantalum, tungsten, molybdenum, niobium, and $0 \leq x, y,$ and $z \leq 3$, and combinations thereof; pyrophyllite, talc, olivine, calcium carbonate, merylinite clay, bentonite clay, and sodium silicate.

86. The method of claim 84, wherein the at least one coating has a thickness of between about 0.5 micron and about 250 microns.

87. The method according to claim 53, wherein the step of providing a source material to a reaction vessel comprises providing a source material to a reaction vessel having a melting point of greater than about 1600° C.

88. The method according to claim 53, wherein the reaction vessel further includes a baffle separating the inner chamber of the reaction vessel into a first section and a second section, the baffle having a plurality of apertures therethrough, wherein the apertures place the first section and second section in fluid communication with each other.

89. The method according to claim 88, wherein the baffle has a fractional open area between about 1% and about 40%.

90. The method according to claim 53, wherein the step of forming at least one single crystal of the Group III metal nitride comprises the steps of providing a seed crystal of the Group III metal nitride to the reaction vessel and depositing a single crystal of the Group III metal nitride on the seed crystal.

91. The method according to claim 53, wherein the step of forming at least one single crystal of the Group III metal nitride comprises the steps of providing a seed crystal of a material having a lattice mismatch of less than about 20% with respect to the Group III metal nitride to the reaction vessel and depositing a single crystal of the Group III metal nitride on the seed crystal.

92. The method according to claim 91, where said seed crystal has a lattice mismatch of less than about 5% with respect to the Group III metal nitride.

93. The method according to claim 91, wherein the seed crystal comprises one of silicon carbide or sapphire.

94. The method according to claim 53, wherein the step of forming at least one single crystal of the Group III metal nitride comprises the steps of spontaneously nucleating the Group III metal nitride within the reaction vessel and depositing at least single crystal of the Group III metal nitride on the spontaneously nucleated Group III metal nitride.

95. The method according to claim 53, wherein the step of heating a first end of the reaction vessel to a first temperature and a second end of the reaction vessel opposite the first end to a second temperature comprises heating a first end of the reaction vessel to a first temperature and a second end of the reaction vessel opposite the first end to a second temperature, the first temperature being greater than the second temperature, and wherein the method further comprises the steps of:

a) pressurizing the reaction vessel to a first pressure, the first pressure being sufficient to suppress decomposition of the Group III metal nitride at a melting point of the Group III metal nitride;

b) melting the source material; and c) cooling the reaction vessel at a predetermined cooling rate to a temperature below the melting point of the Group III metal nitride.

96. The method according to claim 95, wherein the first temperature is between about 5° C. and about 300° C. greater than the second temperature.

97. The method according to claim 95, wherein the step of pressurizing the reaction vessel to a first pressure comprises pressurizing the reaction vessel to a pressure of between about 55 and about 80 kbar.

98. The method according to claim 95, wherein the step of pressurizing the reaction vessel to a first pressure comprises pressurizing the reaction vessel to a pressure of at least about 0.2 kbar.

99. The method according to claim 95, wherein the step of melting the source material comprises heating the reaction vessel to between about 1200° C. and about 3200° C.

100. The method according to claim 95, wherein the step of cooling the reaction vessel at a predetermined cooling rate to a temperature below the melting point of the Group III metal nitride comprises cooling the reaction vessel at a cooling rate of between about 0.02° C./hr and about 100° C./hr.

* * * * *